(12) United States Patent
Kanazawa et al.

(10) Patent No.: US 6,217,719 B1
(45) Date of Patent: Apr. 17, 2001

(54) PROCESS FOR THIN FILM FORMATION BY SPUTTERING

(75) Inventors: Hidehiro Kanazawa; Minoru Otani, both of Tokyo; Kenji Ando, Kawasaki; Yasuyuki Suzuki, Yokohama; Ryuji Biro, Kawasaki, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/315,016

(22) Filed: May 20, 1999

(30) Foreign Application Priority Data

| May 22, 1998 | (JP) | 10-141454 |
| Jun. 17, 1998 | (JP) | 10-170010 |
| Sep. 17, 1998 | (JP) | 10-263466 |
| Apr. 26, 1999 | (JP) | 11-118172 |

(51) Int. Cl.⁷ .................................. C23C 14/34
(52) U.S. Cl. .............. 204/192.12; 204/192.13; 204/192.15; 204/192.16; 204/192.22; 204/298.07; 204/298.13; 204/298.12
(58) Field of Search ............. 204/192.12, 192.13, 204/192.15, 192.16, 192.22, 298.07, 298.13, 298.12; 428/688, 696, 697, 698, 699, 702, 934, 938

(56) References Cited

U.S. PATENT DOCUMENTS

| 3,607,697 | * | 9/1971 | Shirn et al. | 204/192.22 |
| 3,962,062 | * | 6/1976 | Ingrey | 204/192.22 |
| 4,673,476 | * | 6/1987 | Mitsui et al. | 204/192.28 |

FOREIGN PATENT DOCUMENTS

| 5-65648 | 3/1993 | (JP) . |
| 5-65649 | 3/1993 | (JP) . |
| 7-56001 | 3/1995 | (JP) . |
| 8-201601 | * 8/1996 | (JP) . |
| 2556206 | 9/1996 | (JP) . |
| 9-68601 | 3/1997 | (JP) . |
| 9-263937 | 10/1997 | (JP) . |

OTHER PUBLICATIONS

S. Yoshida H. Yajima, *Hakumaku Hikari Devaisu (Thin–Film Optical Device)*, Tokyo Gaigaku Shuppankai K.K., pp. 95–97 (with translation) (1994). (Month unknown).

* cited by examiner

*Primary Examiner*—Alan Diamond
(74) *Attorney, Agent, or Firm*—Fitzpatrick, Cella, Harper & Scinto

(57) ABSTRACT

A process is provided for forming a thin film having refractive index thereof varying continuously or stepwise in a thickness direction. The process comprises sputtering in a vacuum chamber by introducing, during film formation, at least two kinds of gases selected from a nitrogen-containing gas, an oxygen-containing gas, and a fluorine-containing gas with the flow rate ratio of the gases varied continuously or stepwise. This process enables variation of the refractive index in the thickness direction, simply without difficulty.

17 Claims, 18 Drawing Sheets

PROCESS FOR THIN FILM FORMATION BY SPUTTERING

BACKGROUND OF THE INVENTION

1. Field of the Invention

The present invention relates to a thin film formed by sputtering for coating mainly on a surface of an optical element, and a process for forming the thin film.

2. Related Background Art

A film having a refractive index continuously varying, like a refraction-gradient film, is formed generally by CVD as shown in Japanese Patent Application Laid-Open Nos. 5-65648, 5-65649, 7-56001, and 9-68601. It can be formed also by a sputtering method by use of plural targets as shown by S.Yoshida and H.Yajima ("Hakumaku Hikari Devaisu (Thin-Film Optical Device)" (Tokyo Daigaku Shuppan K.K.)). An oxide film having refraction-gradient can be formed by sputtering by varying an oxygen partial pressure to control oxidation number, or by varying the film density.

A refraction-gradient film can be produced by using a fluoride as a target material, introducing an oxygen-containing gas, and varying the electric power applied to the target as shown in Japanese Patent Application Laid-Open No. 8-201601.

Ion beam sputtering can be employed with an oxide as the target as shown Japanese Patent No. 2,556,206.

In still another method, a metal film is formed by use of plural metallic targets and then the metal film is converted to a compound as shown in Japanese Patent Application Laid-Open No. 9-263937.

Conventionally, a film having a refractive index varying continuously, like refraction-gradient film, is formed from combination of an oxide material having an intermediate refractive index, and a fluoride material or a nitride material.

Gases containing a metal element employed generally in CVD are dangerous because of their flammability, corrosiveness, toxicity, and so forth, which causes high cost for the gas supply system and the gas treatment system. The film formed at a low base-plate temperature (not higher than 200° C.) will be affected adversely by impurity of the gas component to have lower density, lower adhesiveness, lower strength, and poor optical properties.

In formation of a laminated film in which a refraction-gradient film is one of the constituting layers, practice of CVD only for the refraction-gradient film is not efficient.

In sputtering with plural kinds of targets, the respective targets of different sputtering yields should be controlled separately to control the refractive index of the formed film on the base plate. This process for controlling arbitrarily the refractive index of the film is complicated due to the need to control the applied electric power, partial gas pressure, distribution of sputtered particles, and so forth.

Reactive sputtering is more complicated because of the difference of reactivity between the target materials.

The method in which the degree of the oxidation of oxidation film is varied by the oxygen partial pressure to vary the refractive index is limited to an applicable wavelength region because of the dependency of the light absorption on the oxidation degree.

The method in which the film density is varied poses problems in weatherability, if the density is lower, such as variation of the refractive index with lapse of time by moisture absorption, and burning of the base plate by penetration of moisture through the film.

The method disclosed in Japanese Patent Application Laid-Open No. 8-201601, in which applied electric power to a fluoride target is varied with the rate of introduced oxygen-containing gas kept unchanged, varies the oxidation degree by varying the film-forming rate. The productivity of this method becomes extremely low when obtaining a film of high oxidation degree.

The method disclosed in Japanese Patent 2,556,206, in which a dielectric material such as an oxide or a fluoride is used as the target material, has the disadvantage that the purity of the target cannot readily be raised and the impurity contaminates the film, which affects adversely the optical properties such as light absorption of the film. Further, the dielectric material target is expensive. When a granular target is employed, the sputtered particles form clusters in the film depending on the size of the granules, which varies the refractive index of the film, the density, surface state, and internal structure of the film to lower the film quality in the film forming process. Furthermore, DC current cannot be effectively applied to the dielectric target to lower the rate and limit the arbitrariness in the process.

The apparatus provided with plural targets of different metal materials in a reaction chamber, as shown in Japanese Patent Laid-Open No. 9-263937, has a complicated structure including a base plate delivery mechanism, and is expensive. With such an apparatus, two or more treatment steps are necessary for obtaining a simple film of one refractive index since a metal film is formed once and is converted to a metal compound.

With increase of the film thickness, as is expected, the necessary for the film formation increase, and the stress in the film increases to lower the durability of the film.

Conventionally, a film having a refractive index varying continuously, like a refraction-gradient film, is formed from combination of an oxide material having an intermediate refractive index, and a fluoride material or a nitride material. The refractive index variation is limited to be in a narrow range between the higher refractive index and the intermediate refractive index, or between the intermediate refractive index and the lower refractive index.

SUMMARY OF THE INVENTION

An object of the present invention is to provide a process for forming, by sputtering, a thin film having a refraction-gradient film without using plural target materials to obtain a high light transmittance in a broad wavelength range independently of the film density.

Another object of the present invention is to provide a process for forming a thin film of high refractive index with a simple control system.

The process of an embodiment of the present invention forms a thin film having the refractive index thereof varying continuously or stepwise in a thickness direction. The process is conducted by sputtering by introducing, during film formation, at least two kinds of gases selected from a nitrogen type gas, an oxygen type gas, and a fluorine type gas with the flow rate ratio of the two kinds of gases varied continuously or stepwise.

The process of another embodiment of the present invention forms, by sputtering, a thin film which is constituted of a first thin film having a first refractive index and a second thin film having a second refractive index different from the first refractive index. The process is conducted by sputtering by introducing, during film formation, at least two kinds of gases selected from a nitrogen type gas, an oxygen type gas, and a fluorine type gas with a flow rate ratio of the gases varied continuously or stepwise to obtain the refractive index varying continuously or stepwise in a thickness direction in the neighbourhood of the boundary between the first thin film and the second thin film.

In the sputtering in the present invention, the composition ratio of the nitride, the oxide, and the fluoride in the formed film can be varied by varying the ratio of the introduction flow rates of the reactive gas species. Thereby, the refractive index can be varied arbitrarily simply without using a large apparatus for the process. By this process, an excellent optical thin film can be formed without lowering the density of the film.

DESCRIPTION OF THE PREFERRED EMBODIMENT

The present invention provides a process of forming a compound film by sputtering with the refractive index of the formed film controlled by varying the ratio of gas flow rates of a nitrogen type gas, an oxygen type gas, and a fluorine type gas continuously or stepwise with lapse of time. According to the present invention, the refractive index of the film can be varied arbitrarily without difficulty by controlling the flow rate ratios of the above gases. The variation of the gas flow rate ratio is considered to vary the composition ratio of the nitride, oxide, and fluoride in the film.

Figure 1:
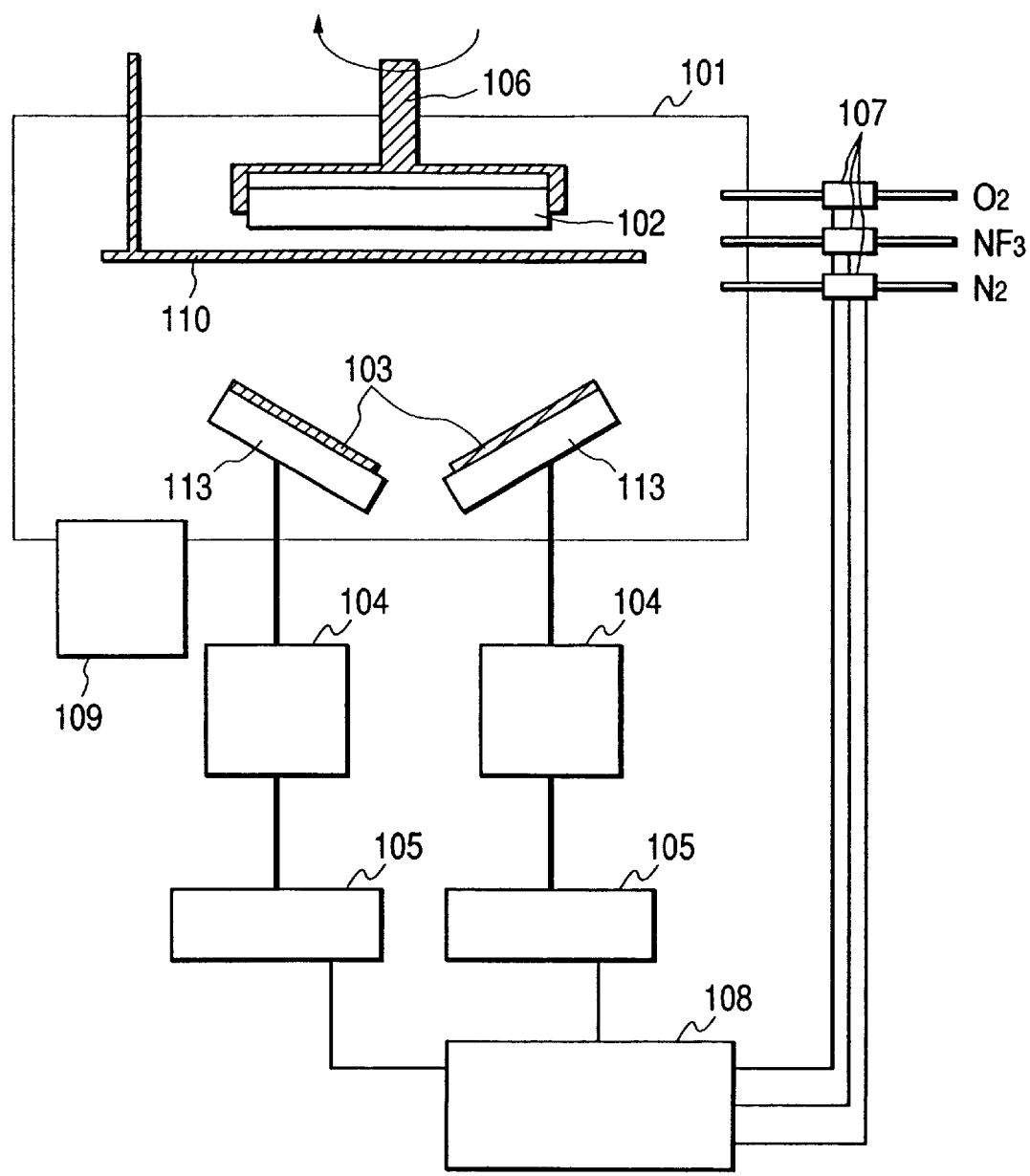
FIG. 1 illustrates schematically a sputtering apparatus employed for forming the optical thin film in Example 1.

FIG. 1 illustrates schematically a sputtering system employed in the present invention. Vacuum chamber 101 is provided with an evacuation device 109 for evacuating the interior thereof. Targets 103 are fixed to magnetron cathodes 113. In this embodiment, two targets are employed to offset the irregularity of the thickness of base plate 102. However, the target may be single. Shutter 110 is provided as necessity requires in vacuum chamber 101 to screen base plate 102 from targets 103 until the electric discharge becomes stable.

Power source 105 applies electric power as necessity requires through matching boxes 104 to cathodes 113. Base plate holder 106 for holding base plate 102 is rotated by a rotation mechanism to prevent nonuniformity of the film thickness on the base plate. The gas introduction flow rates are controlled by mass flow controllers 107. The applied power and the gas flow rates are controlled by personal computer 108.

The process for forming a thin film by means of this system is explained below.

The inside of vacuum chamber 101 is evacuated by evacuation system 109 to $1\times10^{-4}$ Pa or less, for example. Thereto gases are introduced at a prescribed gas flow rate through mass flow controllers 107, which gas flow rates are controlled by personal computer 108. Electric power is supplied to targets 103 to cause glow discharge, generating plasma containing at least two of nitrogen, oxygen, and fluorine with power control by personal computer 108. Then, shutter 110 is opened to start film formation on base plate 102. During the film formation, the supply flow rate ratio of the respective compound gases is varied with lapse of time. Thereby, a thin refraction-gradient film is obtained which has the refractive index varying in the thickness direction.

The material of the target in the present invention may be a nitride, an oxide, or a fluoride. However, nondielectric metals are preferred in consideration of control of the formation of the refraction-gradient film. The metals include Al, Bi, Hf, Pb, Zr, Y, and Mg.

The nitrogen type gas employed in the present invention is the gas containing nitrogen, i.e. the nitrogen-containing gas, specifically at least one selected from the group of $NF_3$, $NH_3$, $N_2O$, $NO$, $NO_2$ and $N_2$, without dilution or with dilution with an inert gas such as He and Ar.

The oxygen type gas employed in the present invention is the gas containing oxygen, i.e. the oxygen-containing gas, specifically at least one selected from the group of $O_2$, $O_3$, $N_2O$, $NO$, $NO_2$, $CO_2$, $CO$, $SO_2$, and $H_2O$, without dilution or with dilution with an inert gas such as He and Ar.

The fluorine type gas employed in the present invention is a gas containing fluorine, i.e. the fluorine-containing gas, specifically at least one selected from the group of $CF_4$, $NF_3$, $HF$, $SF_6$, $BF_3$, $CHClF_2$, $SiF_4$, and $F_2$, without dilution or with dilution with an inert gas such as He and Ar.

A preferred power source in the present invention is an RF source typically of 13.56 MHz and/or a DC source. For improvement of the deposition rate, preferred is DC voltage with a metal target. A microwave power source is also preferred which supplies microwave typically of 2.45 MHz.

The base plate for formation of the thin film includes transparent insulating base plates made from a material such as quartz, fluorite, glass, and alumina; and reflective electroconductive base plates made from aluminum. The above transparent insulating base plate having a reflective electroconductive film comprised of aluminum and so forth formed thereon are also useful.

The mode of control of the flow rate ratio of the respective compound-type gases depends on the properties of the film to be prepared. For example, the flow rate ratio of the gases may be increased or decreased continuously or may be increased or decreased stepwise. In the case where the refractive index is gradually increased (or gradually decreased) in a thickness direction from the base plate side to the middle portion and is gradually decreased (or gradually increased from the middle portion to the upper face), the flow rate ratio is gradually increased (or gradually decreased), and then gradually decreased (or gradually increased).

The resulting thin film is composed of a nitride, an oxide, or a fluoride, or a mixture thereof, and the refractive index of the film will vary with the variation of the component ratio.

The present invention is suitable, in particular, for formation of films of aluminum oxide, bismuth oxide, hafnium oxide, lead oxide, zirconium oxide, yttrium oxide, magnesium oxide, and the like. These films contain some fluorine corresponding to the amount of the fluoride type gas, and/or some nitrogen corresponding to the amount of the nitride type gas.

The present invention is useful also for formation of a film of aluminum fluoride, bismuth fluoride, hafnium fluoride, lead fluoride, zirconium fluoride, yttrium fluoride, magnesium fluoride, and the like, which contain some oxygen and/or nitrogen.

The present invention is useful also for formation of a film of aluminum nitride, or the like, which contain some oxygen and/or fluorine.

The present invention is described below in more detail by reference to drawings without limiting the invention in any way.

EXAMPLE 1

FIG. 1 illustrates schematically the sputtering system employed in this example. Vacuum chamber 101 is connected to evacuation system 109 for evacuating the inside thereof. Targets 103 made of aluminum are fixed to magnetron cathodes 113. Two targets are employed to offset irregularity of the thickness of base plate 102.

In vacuum chamber 101, shutter 110 is provided to screen base plate 102 from targets 103 until the electric discharge becomes stable. High frequency power sources 105 generate RF of 13.56 MHz to apply the power through matching boxes 104 to the cathodes.

Base plate 102 is made of quartz. Base plate holder 106 for holding base plate 102 is rotatable by a rotation mechanism to offset the film thickness irregularity. Gases of $N_2$, $O_2$, and $NF_3$ are introduced into the chamber. The flow rates of the gases are controlled respectively by mass flow controllers 107. The RF power and the gas flow rates are controlled by personal computer 108.

The optical thin film and the process of film formation in this example are described below specifically.

Vacuum chamber 101 was evacuated to a pressure of $1 \times 10^{-4}$ Pa or lower by evacuation system 109. Then the gases were introduced at prescribed gas flow rates through mass flow controllers 107. The flow rates of gases of $N_2$, $O_2$, and $NF_3$ were controlled by personal computer 108. Then, electric power was supplied from the power source to the targets to generate plasma. The power supply was controlled by personal computer 108, and was raised to 2500 W stepwise in about 3 minutes. Thereafter shutter 110 was opened to start the film formation on the base plate.

Figure 2:
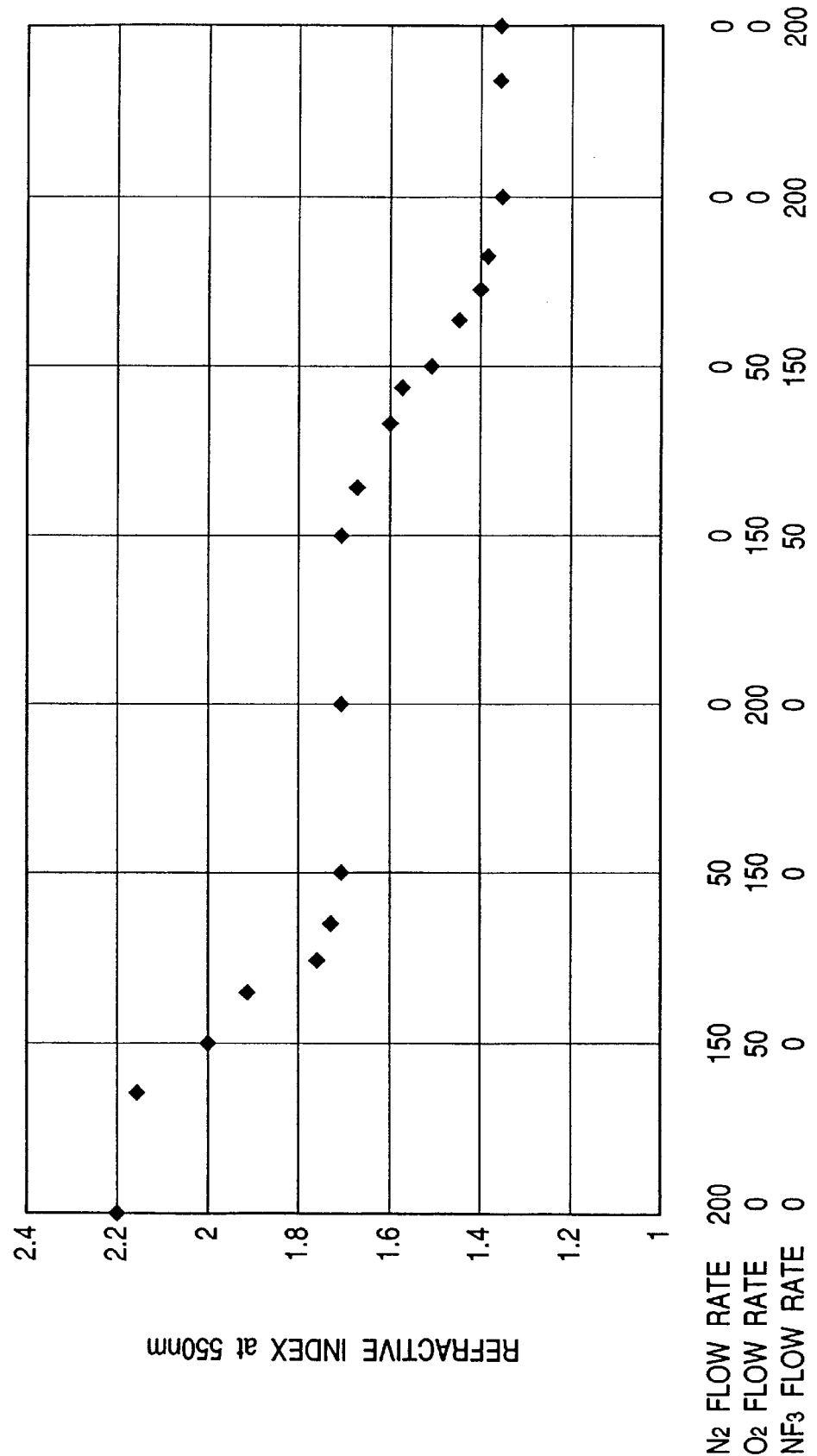
FIG. 2 shows the dependency of the refractive index of the formed film on the gas flow rates of $N_2$, $O_2$, and $NF_3$ introduced in sputtering.

FIG. 2 shows the dependence of the refractive index of the aluminum compound film formed on the base plate by the above process upon the flow rates of the gases of $N_2$, $O_2$, and $NF_3$. As shown in FIG. 2, the refractive index could be controlled by the gas flow rates of $N_2$, $O_2$, and $NF_3$.

EXAMPLE 2

Figure 3:
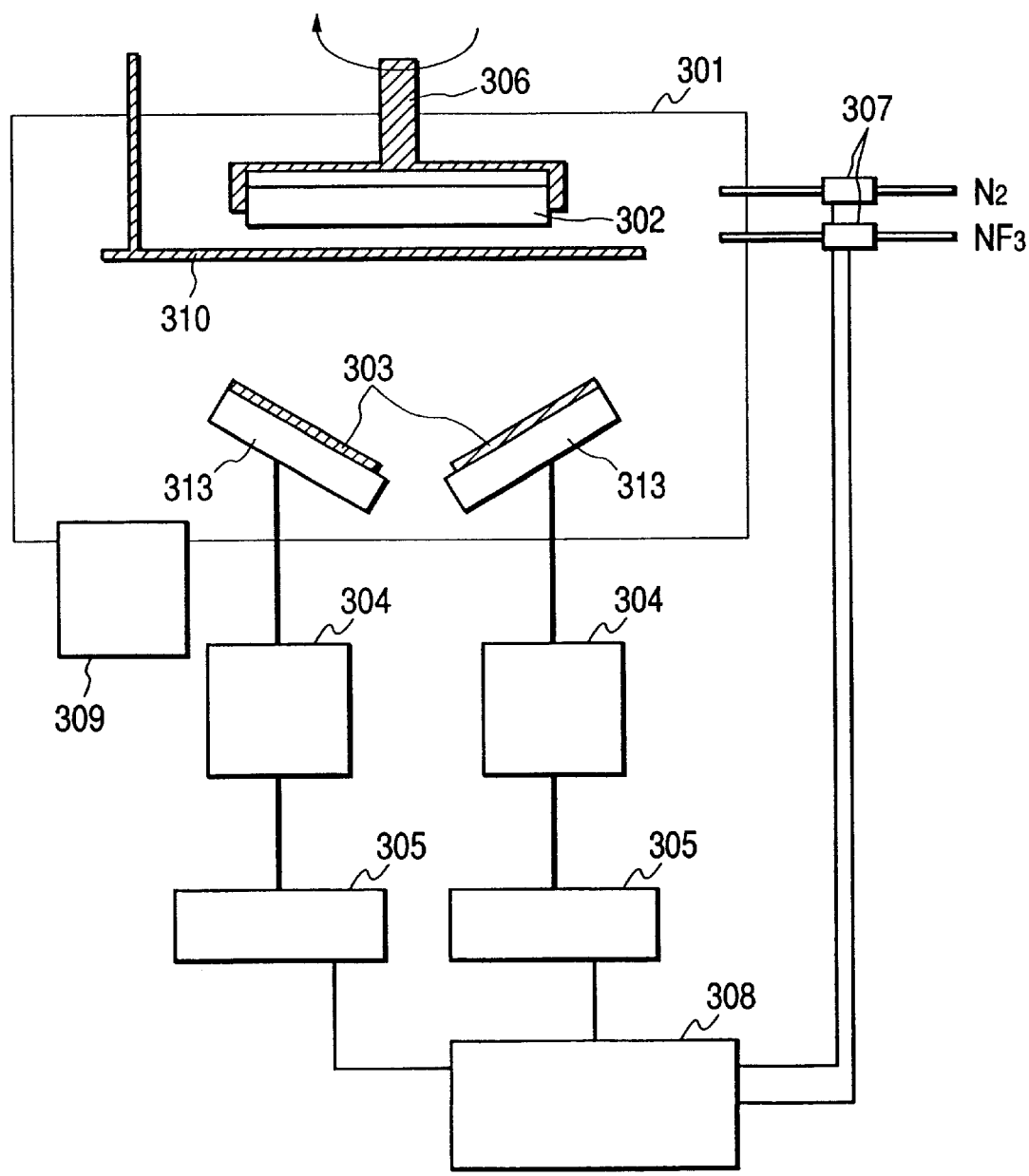
FIG. 3 illustrates schematically a sputtering apparatus employed for forming the optical thin film in Example 2.

FIG. 3 illustrates schematically the sputtering system employed in this Example. Vacuum chamber 301 is connected to evacuation system 309 for evacuating the inside thereof. Targets 303 made of aluminum are fixed to magnetron cathodes 313. Two targets are employed to offset irregularity of the thickness of base plate 302.

In vacuum chamber 301, shutter 310 is provided to screen base plate 302 from targets 303 until the electric discharge becomes stable. High frequency power sources 305 generate RF of 13.56 MHz to apply the power through matching boxes 304 to the cathodes.

Base plate 302 is made of quartz. Base plate holder 306 for holding base plate 302 is rotatable by a rotation mechanism to offset the film thickness irregularity. Gases of $N_2$ and $NF_3$ are introduced into the chamber. The flow rates of the gases are controlled respectively by mass flow controllers 307. The RF power and the gas flow rates are controlled by personal computer 308.

The optical thin film and the process of film formation in this example are described below specifically.

Vacuum chamber 301 was evacuated to a pressure of $1 \times 10^{-4}$ Pa or lower by evacuation system 309. Then the gases were introduced at prescribed gas flow rates through mass flow controller 307. The flow rates of gases of $N_2$ and $NF_3$ were controlled by personal computer 308. Then, electric power was supplied from the power source to the targets to generate plasma. The power supply was controlled by personal computer 308, and was raised to 2500 W stepwise in about 3 minutes. Thereafter shutter 310 was opened to start the film formation on the base plate.

Figure 4:
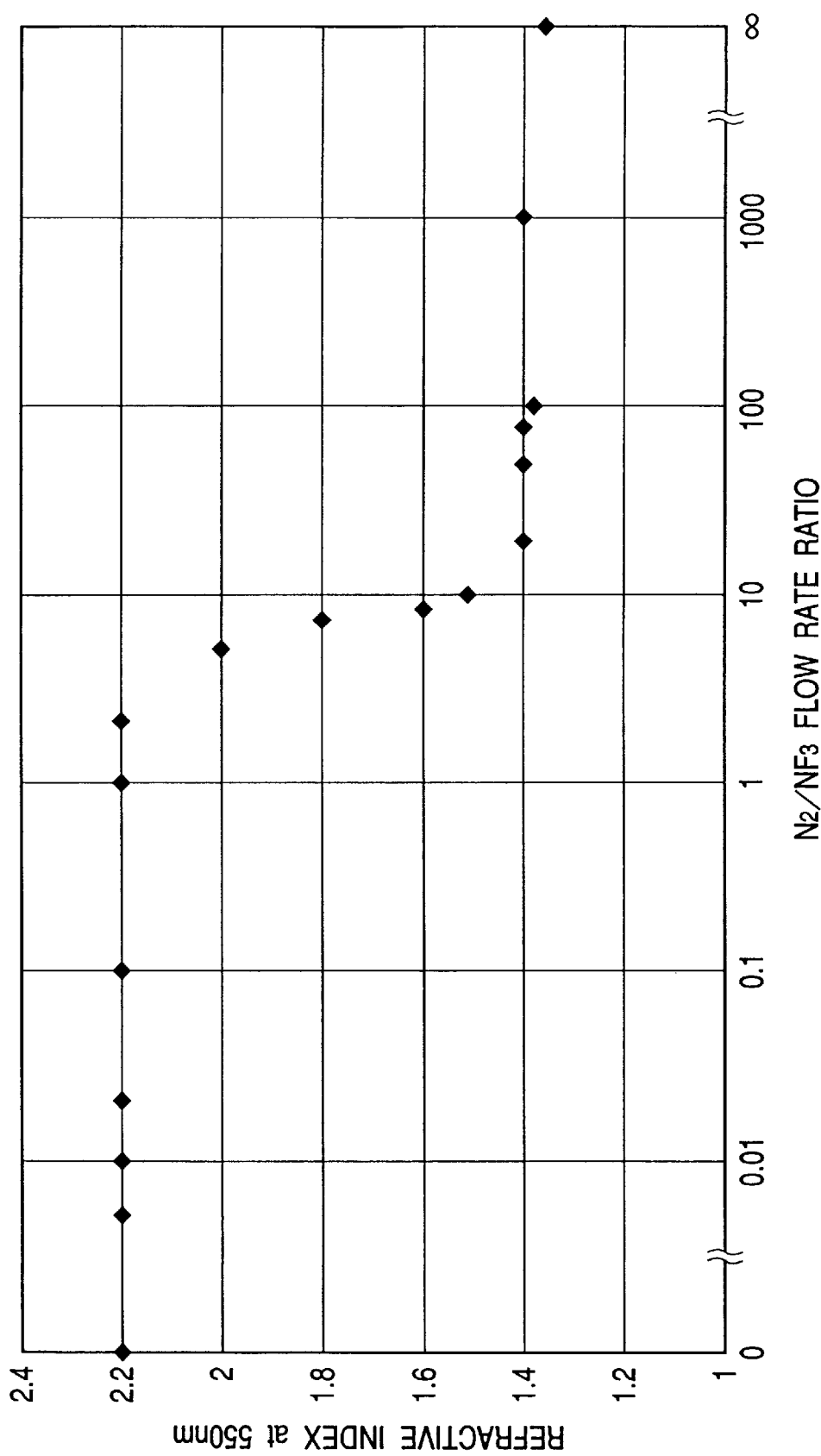
FIG. 4 shows the dependency of the refractive index of the formed film on the gas flow rate ratio of $N_2$ to $NF_3$ introduced in sputtering.

FIG. 4 shows the dependence of the refractive index of the aluminum compound film formed on the base plate by the above process upon the ratio of the gas flow rates of $N_2$ to $NF_3$. As shown in FIG. 4, the refractive index could be controlled by the gas flow rate ratio of $N_2$ to $NF_3$.

EXAMPLE 3

Figure 5:
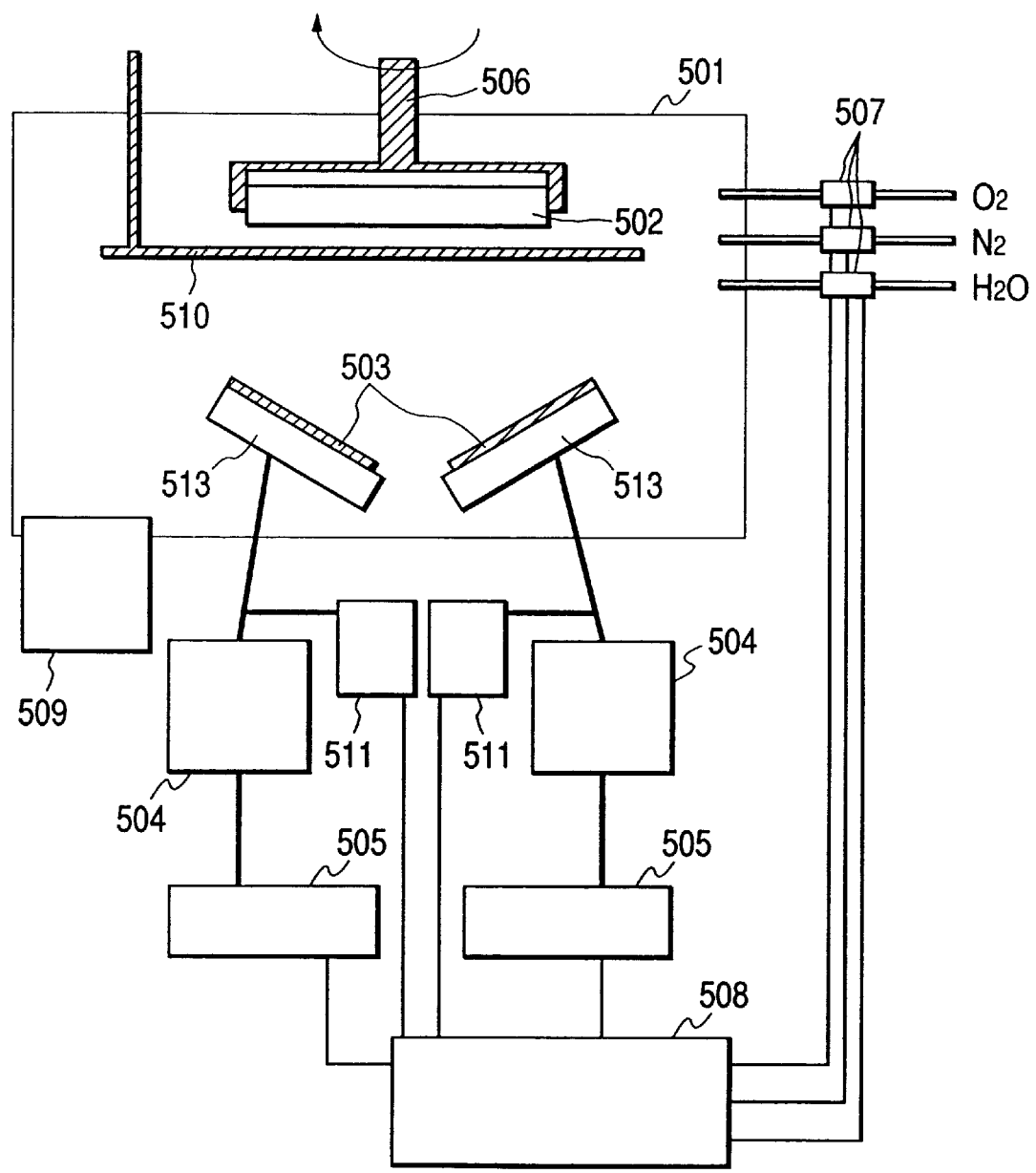
FIG. 5 illustrates schematically a sputtering apparatus employed for forming the optical thin film in Example 3.

FIG. 5 illustrates schematically the sputtering system employed in this Example. Vacuum chamber 501 is connected to evacuation system 509 for evacuating the inside thereof. Targets 503 made of aluminum are fixed to magnetron cathodes 513. Two targets are employed to offset irregularity of the thickness of base plate 502.

In vacuum chamber 501, shutter 510 is provided to screen base plate 502 from targets 503 until the electric discharge becomes stable. High frequency power sources 505 generate RF of 13.56 MHz and apply it through matching boxes 504 to the cathodes. Additionally, electric power is supplied from DC power source 511 to the cathodes.

Base plate 502 is made of quartz. Base plate holder 506 for holding base plate 502 is rotatable by a rotation mechanism to offset the film thickness irregularity. Gases of $N_2$, $H_2O$, and $O_2$ are introduced into the chamber. The flow rates of the gases are controlled respectively by mass flow controllers 507. The RF and DC powers and the gas flow rates are controlled by personal computer 508.

The optical thin film and the process of film formation in this example are described below specifically.

Vacuum chamber 501 was evacuated to a pressure of $1 \times 10^{-4}$ Pa or lower by evacuation system 509. Then the gases of $N_2$, $H_2O$, and $O_2$ were introduced at prescribed gas flow rates through mass flow controllers 507. The flow rates of gases of $N_2$, $H_2O$, and $O_2$ were controlled by personal computer 508. Then, electric power was supplied from the power sources to targets 503 to generate plasma. The power supply was controlled by personal computer 508, and was raised stepwise to RF of 2500 W and DC of 2000 W in about 3 minutes. Thereafter shutter 510 was opened to start the film formation on the base plate. The $H_2O$ gas was introduced with the oxygen at flow rate ratio of 2% to the oxygen gas.

Figure 6:
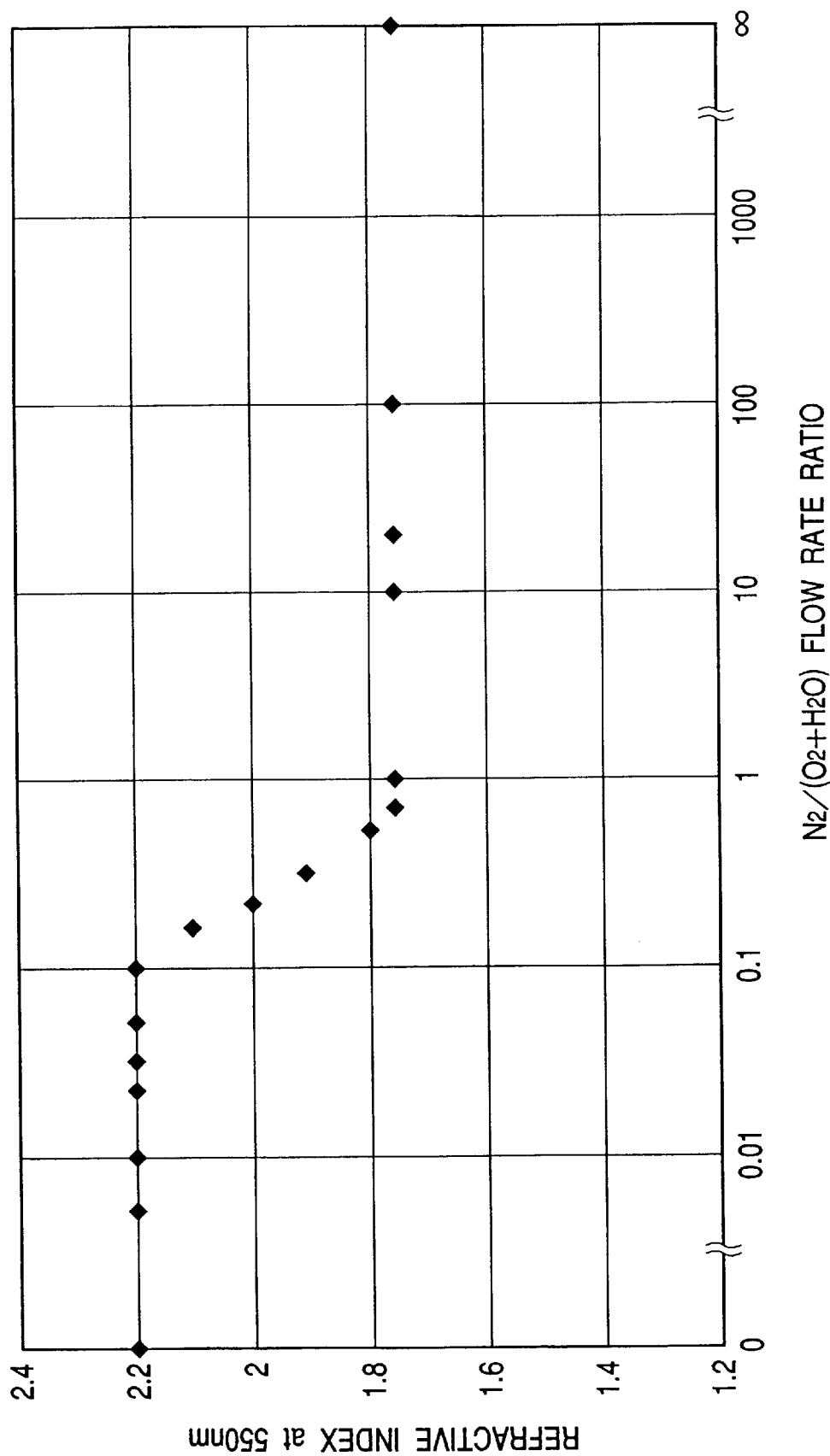
FIG. 6 shows the dependency of the refractive index of the formed film on the gas flow rate ratio of $N_2$ to $O_2$ introduced in sputtering.

FIG. 6 shows the dependence of the refractive index of the aluminum compound film formed on the base plate by the above process upon the ratio of the gas flow rates of $N_2$ to $O_2+H_2O$. As shown in FIG. 6, the refractive index could be controlled by the ratio of the gas flow rates of $N_2$ to $O_2+H_2$.

EXAMPLE 4

Figure 7:
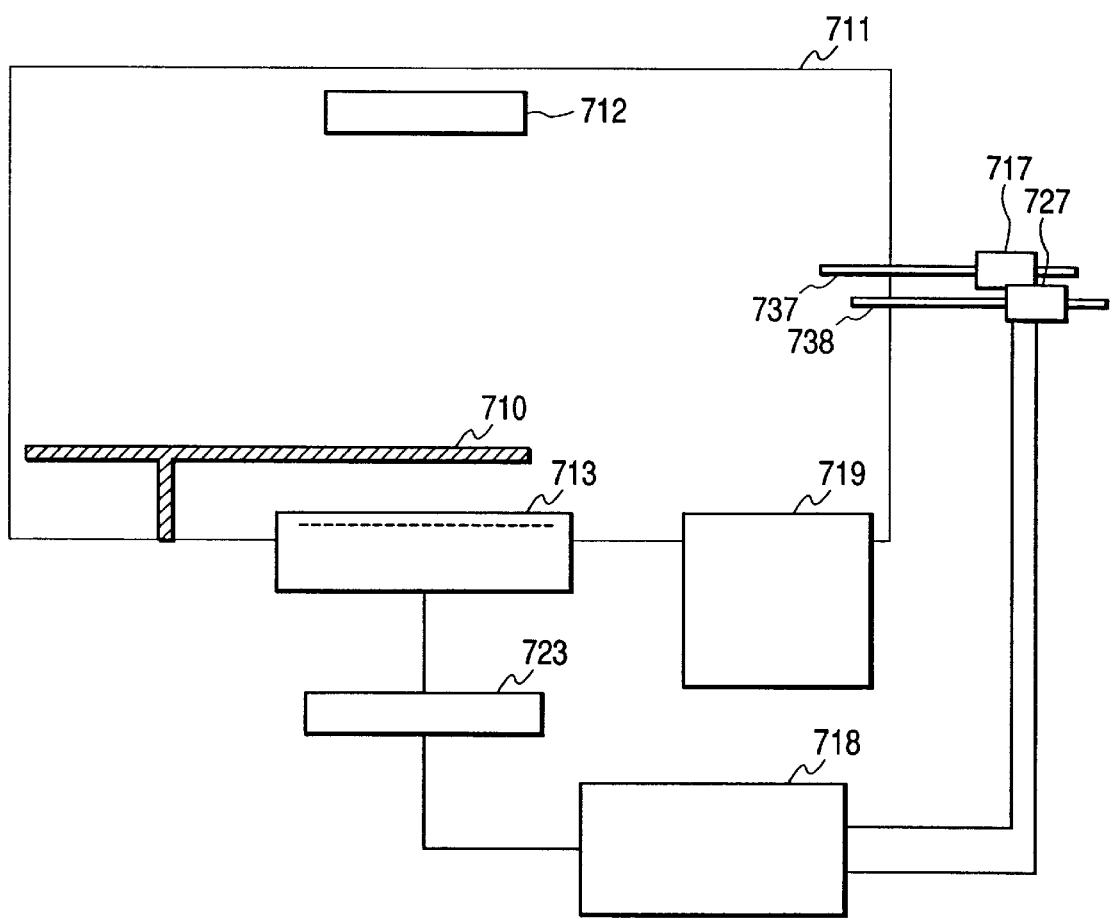
FIG. 7 illustrates schematically a sputtering apparatus employed for forming the optical thin film in Example 4.

FIG. 7 illustrates schematically the sputtering system employed in this Example. Vacuum chamber 711 is connected to evacuation system 719 for evacuating the inside thereof. Target 713 made of aluminum is fixed to magnetron cathode. In vacuum chamber 711, shutter 710 is provided to screen base plate 712 against target 713 until the electric discharge becomes stable. Electric power is supplied from DC power source 723 to the cathode.

Base plate 712 is made of quartz. $O_2$ gas is introduced from gas pipe 737 through mass flow controller 717, and a gas mixture of $Ar/F_2$ is introduced from gas pipe 738 through mass flow controller 727. The mass flow controllers 717, 727 are controlled by personal computer 718. The DC power is also controlled by personal computer 718.

The optical thin film and the process of film formation in this example are described below specifically.

Vacuum chamber 711 was evacuated to a pressure of $1 \times 10^{-4}$ Pa or lower by evacuation system (vacuum pump) 719. Then, $O_2$ gas was introduced at prescribed gas flow rate through mass flow controller 717. The flow rate of $O_2$ was controlled by personal computer 718. Then, electric power was supplied from the power source to the target to generate plasma. The power supply was controlled by personal computer 718, and was raised stepwise to DC of 1000 W in about 3 minutes. Thereafter shutter 710 was opened to start the film formation on the base plate.

Figure 8:
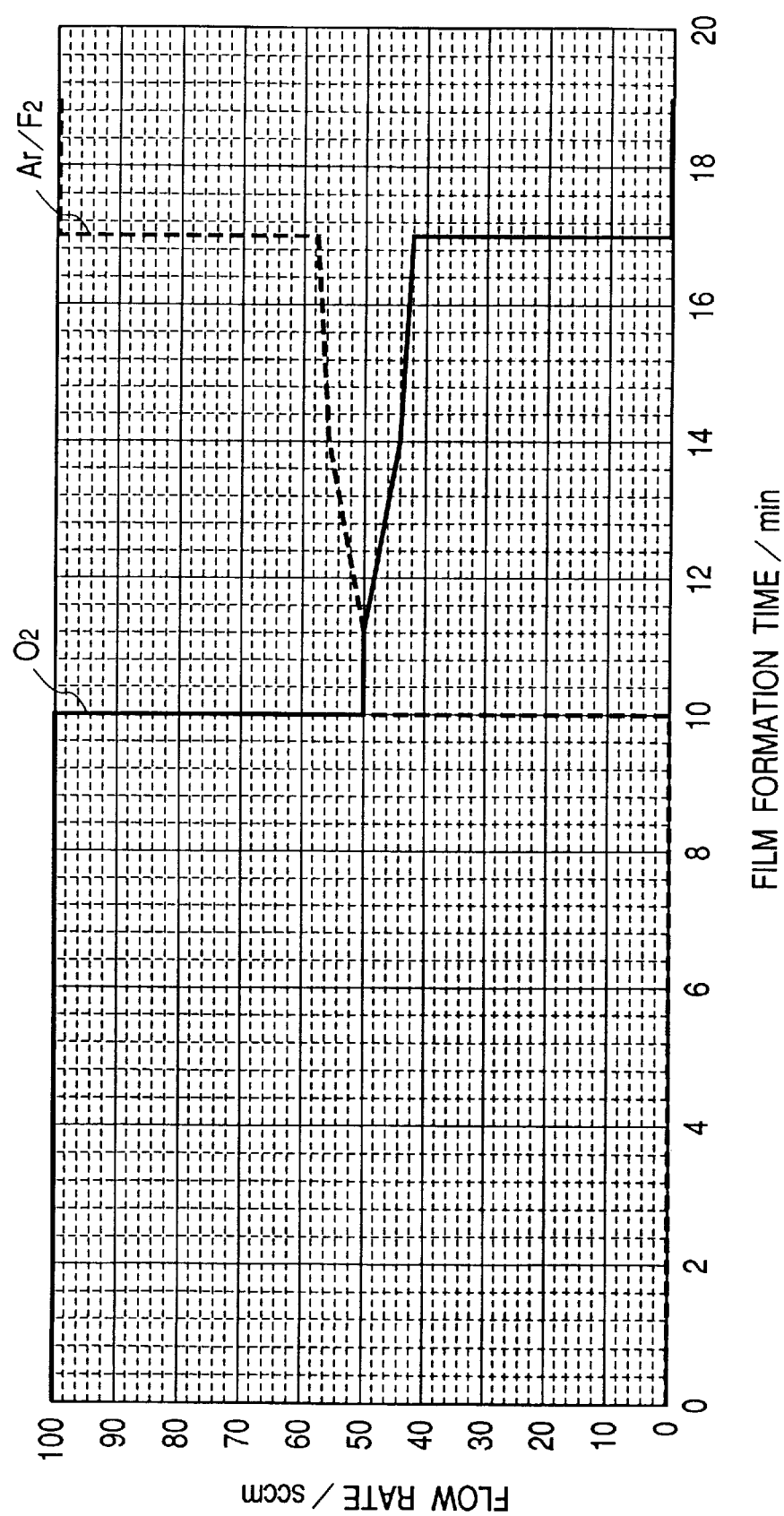
FIG. 8 shows the variation of the flow rates of the introduced gases with time during film formation in Example 4.

The film formation was conducted, as shown in FIG. 8, according to a program of the gas flow rates as a function of film formation time, which had been put into the personal computer. First, the film formation was conducted with introduction of $O_2$ gas only for about 10 minutes. Then, $Ar/F_2$ gas was additionally introduced with continuous increase of the ratio of the $Ar/F_2$ gas to the $O_2$ gas with time for about 5 minutes. Further, film formation was continued with introduction only of $Ar/F_2$ gas for about 2 minutes.

The resulting film was constituted, from the quartz base plate side, of an $Al_2O_3$ layer of about 24.6 nm thick, an intermediate layer of 15.9 nm thick composed of $Al_2O_3$ and $AlF_3$ with stepwise increase of $AlF_x/Al_2O_3$ ratio, and $AlF_3$ layer of 20.7 nm thick at the outside.

Figure 9:
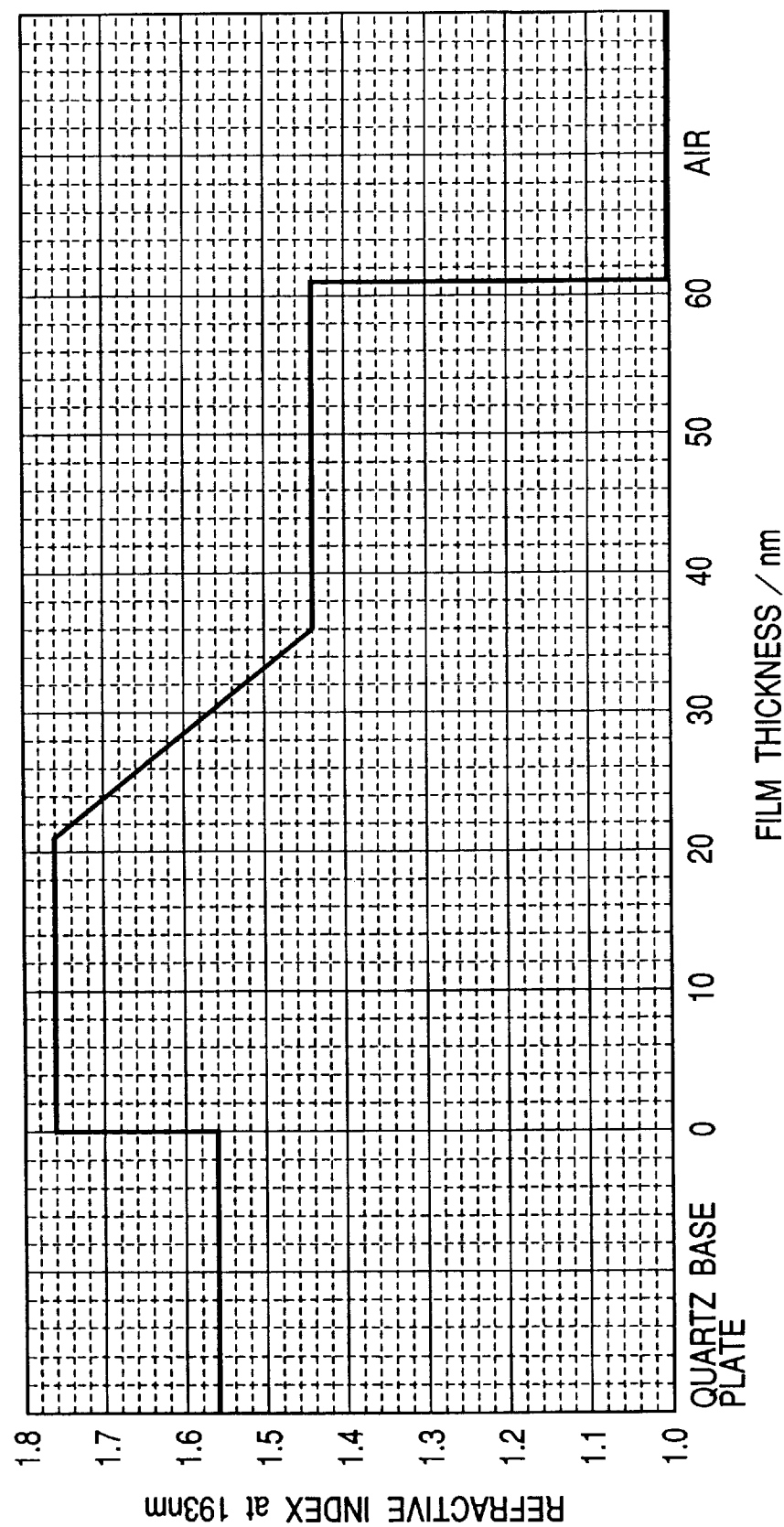
FIG. 9 shows the dependency of the refractive index of the multilayer film on the film thickness thereof in Example 4.
Figure 10:
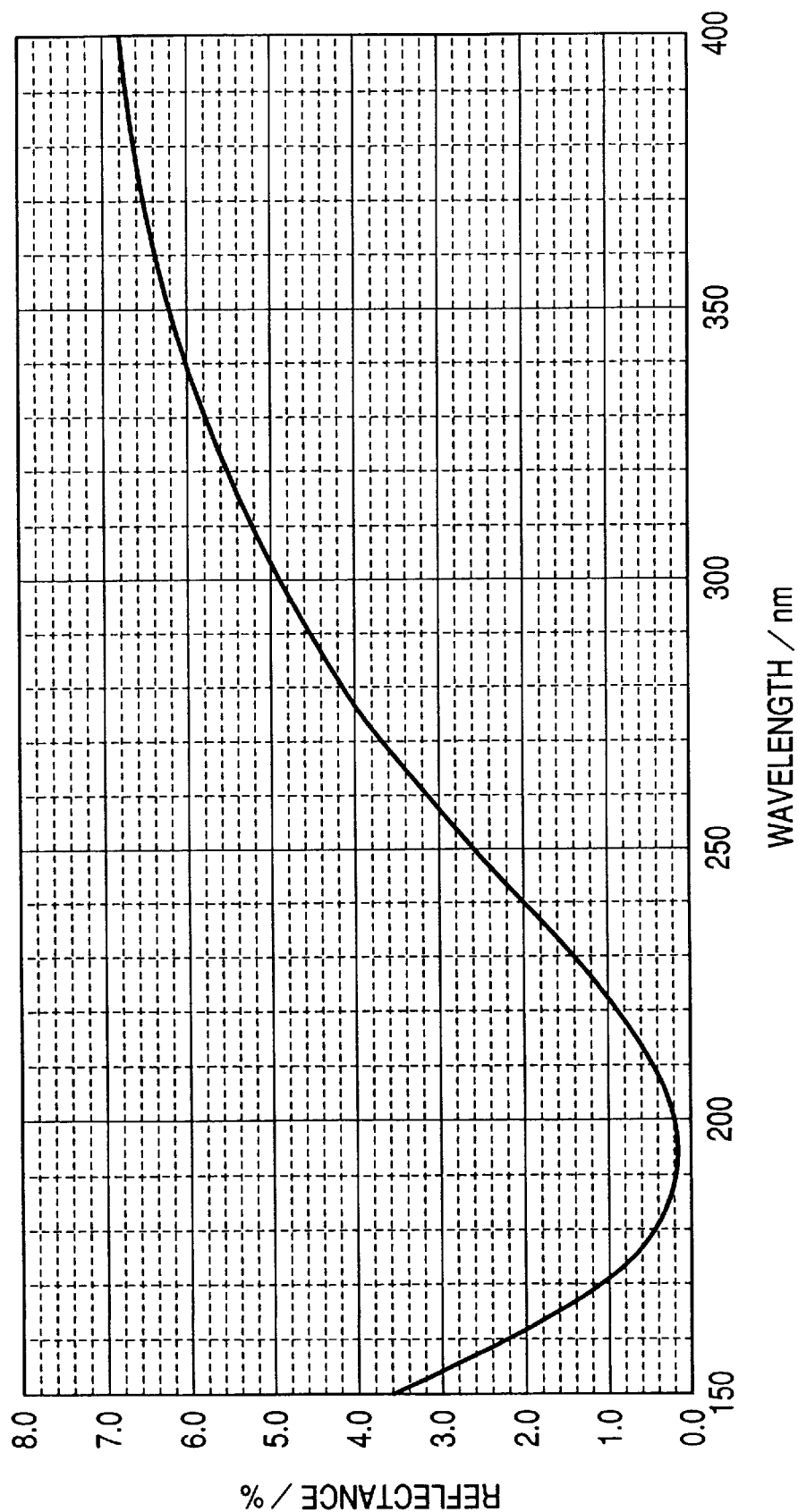
FIG. 10 shows the spectral reflectance of the multilayer film in Example 4.

FIG. 9 shows variation of the refractive index with the increase of the film thickness. FIG. 10 shows the spectral characteristics of the film. These Figures show that the film formed in this example functions as an antireflection film at wavelength of 193 nm.

EXAMPLE 5

Figure 11:
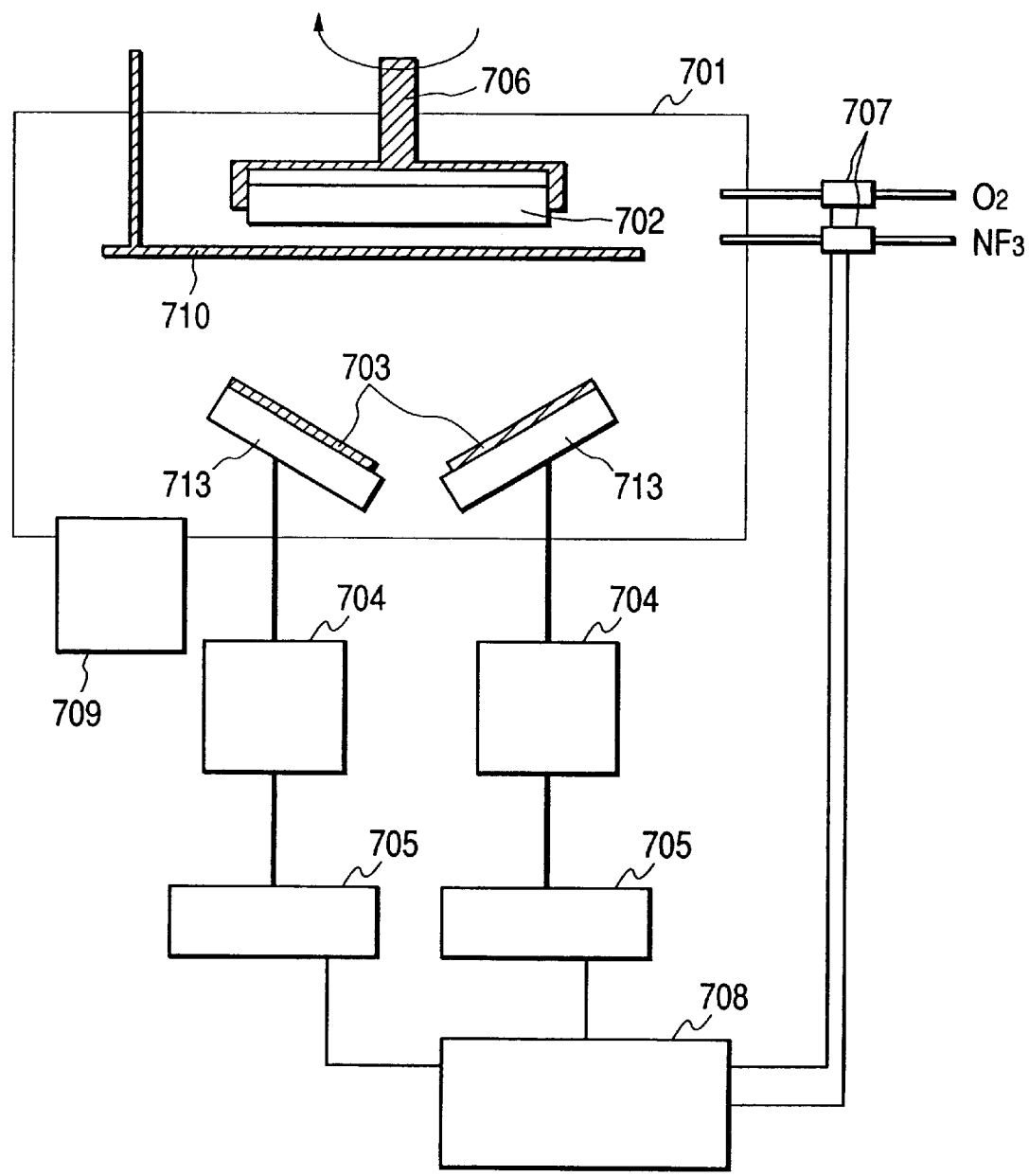
FIG. 11 illustrates schematically a sputtering apparatus employed for forming the optical thin film in Examples 5 and 8.

FIG. 11 illustrates schematically the sputtering system employed in this Example. Vacuum chamber 701 is connected to evacuation system 709 for evacuating the inside thereof. Targets 703 made of hafnium are fixed to magnetron cathodes 713. Two targets are employed to offset irregularity of the thickness of base plate 702.

In vacuum chamber 701, shutter 710 is provided to screen base plate 702 from targets 703 until the electric discharge becomes stable. High frequency power sources 705 generate RF of 13.56 MHz to apply the power through matching boxes 704 to the cathodes.

Base plate 702 is made of quartz. Base plate holder 706 for holding base plate 702 is rotatable by a rotation mechanism to offset the film thickness irregularity.

Gases of $O_2$ and $NF_3$ are introduced into the chamber. The flow rates of the gases are controlled respectively by mass flow controllers 707. The RF power and the gas flow rates are controlled by personal computer 708.

The optical thin film and the process of film formation in this example are described below specifically.

Vacuum chamber 701 was evacuated to a pressure of $1 \times 10^{-4}$ Pa or lower by evacuation system 709. Then the gases were introduced at prescribed gas flow rates through mass flow controllers 707. The flow rates of gases of $O_2$ and $NF_3$ were controlled by personal computer 708. Then, electric power was supplied from the power source to target 703 to generate plasma. The power supply was controlled by personal computer 708, and was raised to 2500 W stepwise in about 3 minutes. Thereafter shutter 710 was opened to start the film formation on base plate 702.

Figure 12:
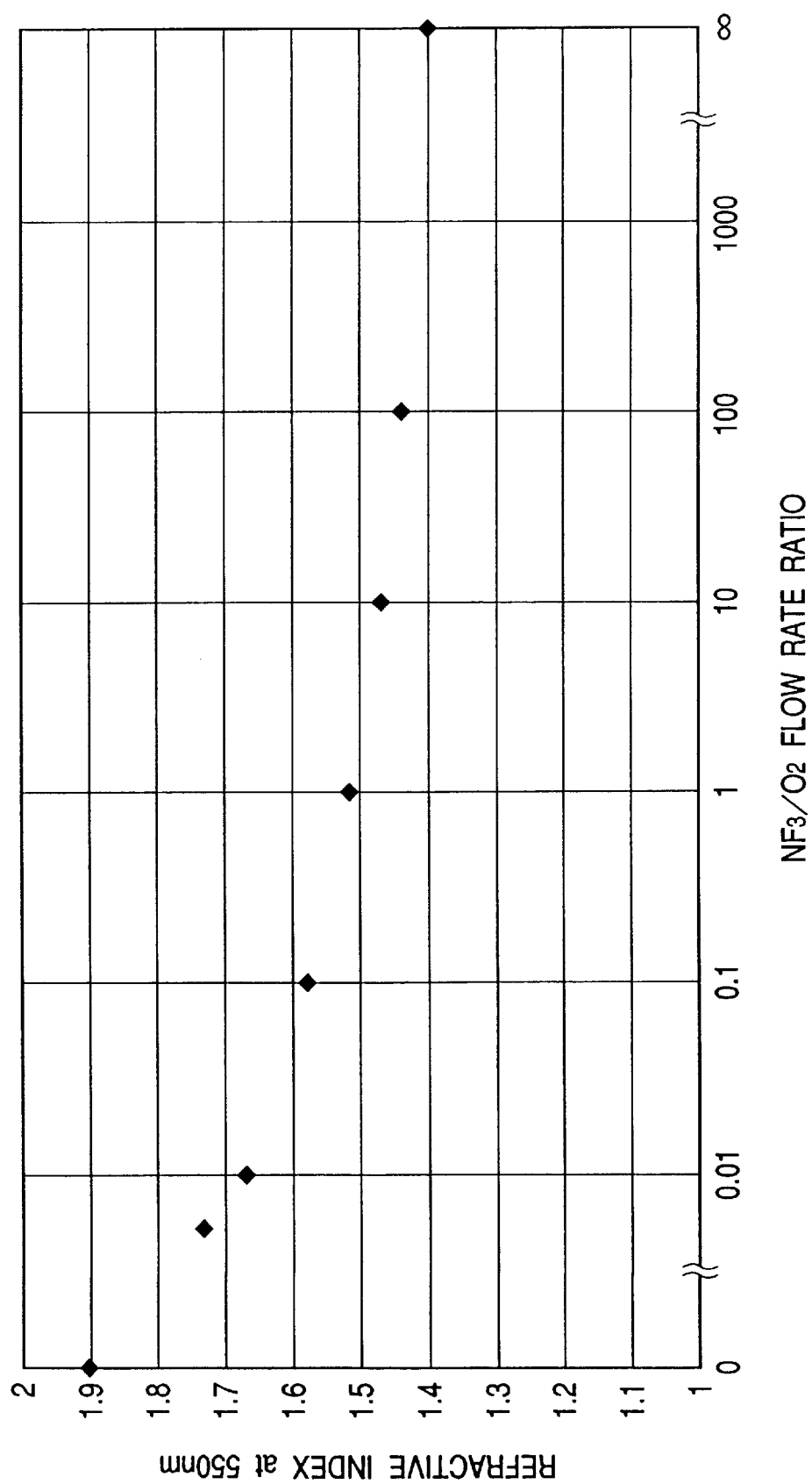
FIG. 12 shows the dependency of the refractive index of the formed film on the gas flow rate ratio of $NF_3$ to $O_2$ in sputtering.

FIG. 12 shows the dependence of the refractive index of the hafnium compound film formed on the base plate by the above process upon the ratio of the gas flow rates of $NF_3$ to $O_2$. As shown in FIG. 12, the refractive index could be controlled by the gas flow rate ratio of $NF_3$ to $O_2$.

A film having refractive index increasing toward the surface of the film was obtained by forming the film with gradual increase of the flow rate ratio of $NF_3/O_2$ with lapse of time according to the above data.

EXAMPLE 6

Figure 13:
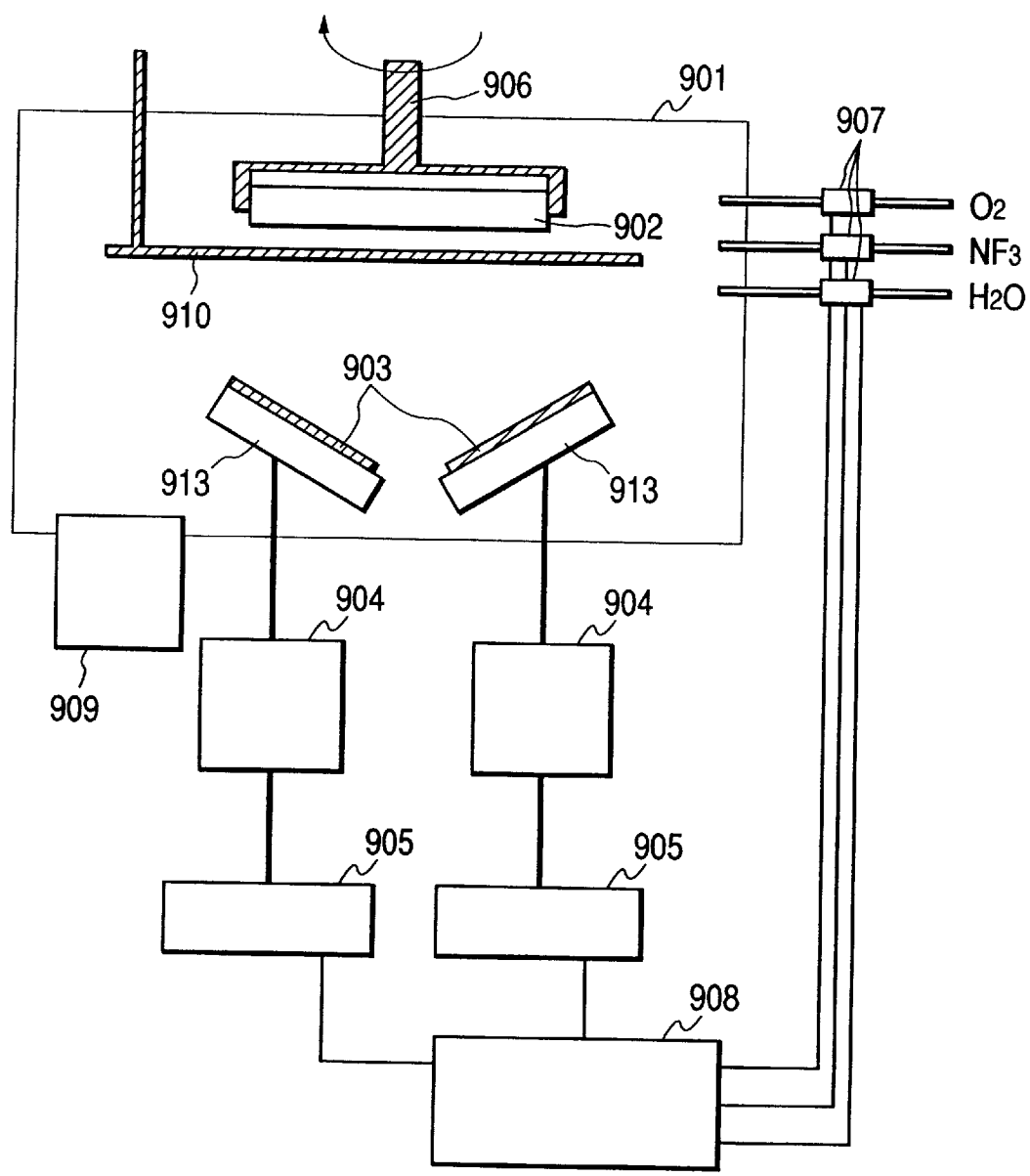
FIG. 13 illustrates schematically a sputtering apparatus employed for forming the optical thin film in Examples 6 and 9.

FIG. 13 illustrates schematically the sputtering system employed in this example. Vacuum chamber 901 is connected to evacuation system 909 for evacuating the inside thereof. Targets 903 made of Y (yttrium) are fixed to magnetron cathodes 913. Two targets are employed to offset irregularity of the film thickness of base plate 902.

In vacuum chamber 901, shutter 910 is provided to screen base plate 902 from targets 903 until the electric discharge becomes stable. High frequency power sources 905 generate RF of 13.56 MHz to apply the power through matching boxes 904 to the cathodes.

Base plate 902 is made of quartz. Base plate holder 906 for holding base plate 902 is rotatable by a rotation mechanism to offset the film thickness irregularity.

Gases of $O_2$, $NF_3$, and $H_2O$ are introduced into the chamber. The flow rates of the gases are controlled respectively by mass flow controllers 907. The RF power and the gas flow rates are controlled by personal computer 908.

The optical thin film and the process of film formation in this example are described below specifically.

Vacuum chamber 901 was evacuated to a pressure of $1 \times 10^{-4}$ Pa or lower by evacuation system 909. Then the $H_2O$ gas was introduced constantly at a flow rate of 2 sccm through mass flow controller 907 during the film formation, and the $O_2$ gas and the $NF_3$ gas were introduced at prescribed gas flow rates through mass flow controllers 907. The flow rates of gases of $O_2$, $NF_3$, and $H_2O$ were controlled by personal computer 908. Then, electric power was supplied from the power source to targets 903 to generate plasma. The power supply was controlled by personal computer 908, and was raised to 2500 W stepwise in about 3 minutes. Thereafter shutter 910 was opened to start the film formation on base plate 902.

Figure 14:
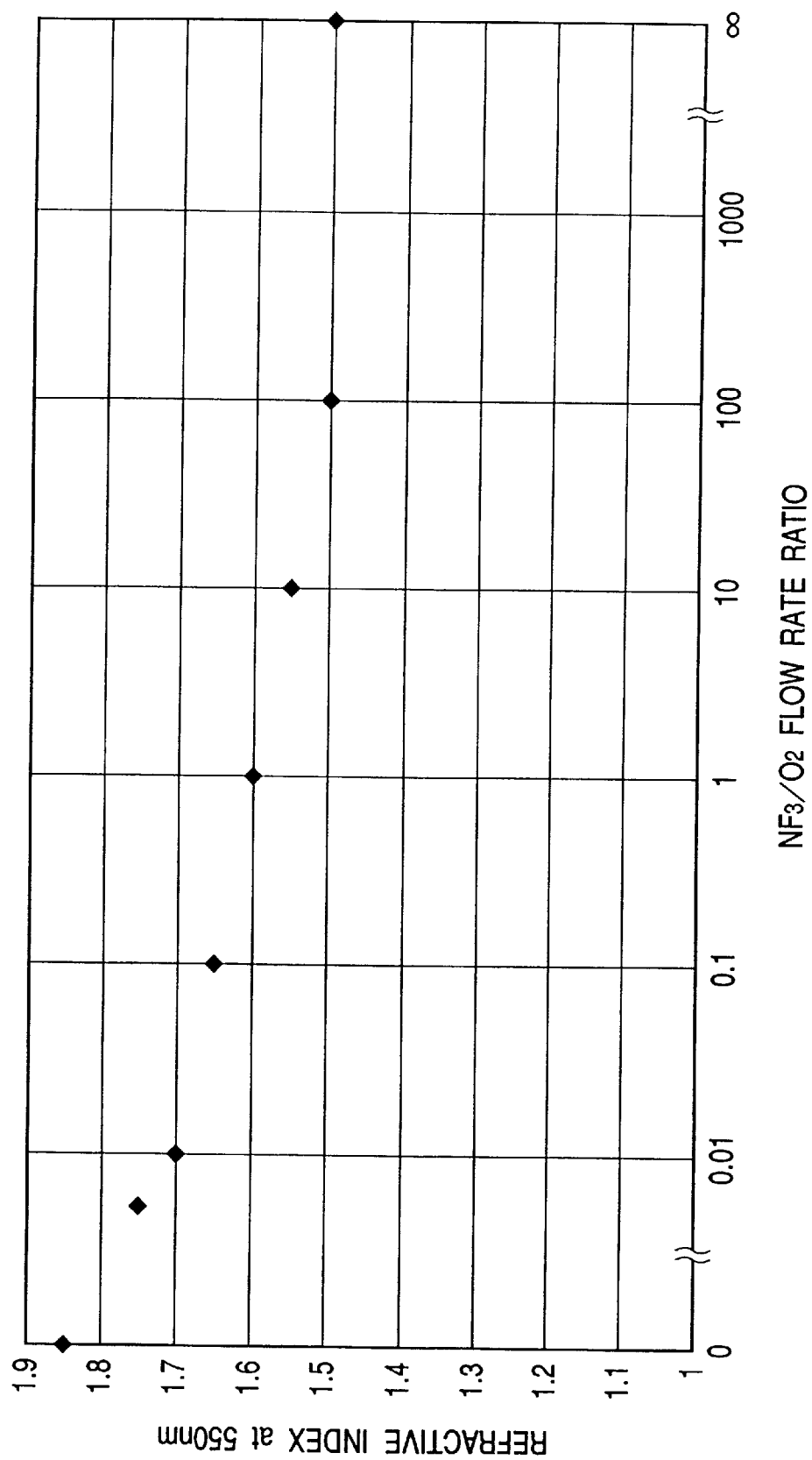
FIG. 14 shows the dependency of the refractive index of the formed film on the gas flow rate ratio of $NF_3$ to $O_2$ in sputtering.

FIG. 14 shows the dependence of the refractive index of the yttrium compound film formed on the base plate by the above process upon the ratio of the gas flow rates of $NF_3$ to $O_2$. As shown in FIG. 14, the refractive index could be controlled by ratio of the gas flow rates of $NF_3$ to $O_2$.

A film having the refractive index increasing toward the surface of the film was obtained by forming the film with gradual increase of the flow rate ratio of $NF_3/O_2$ with lapse of time according to the above data.

EXAMPLE 7

Figure 15:
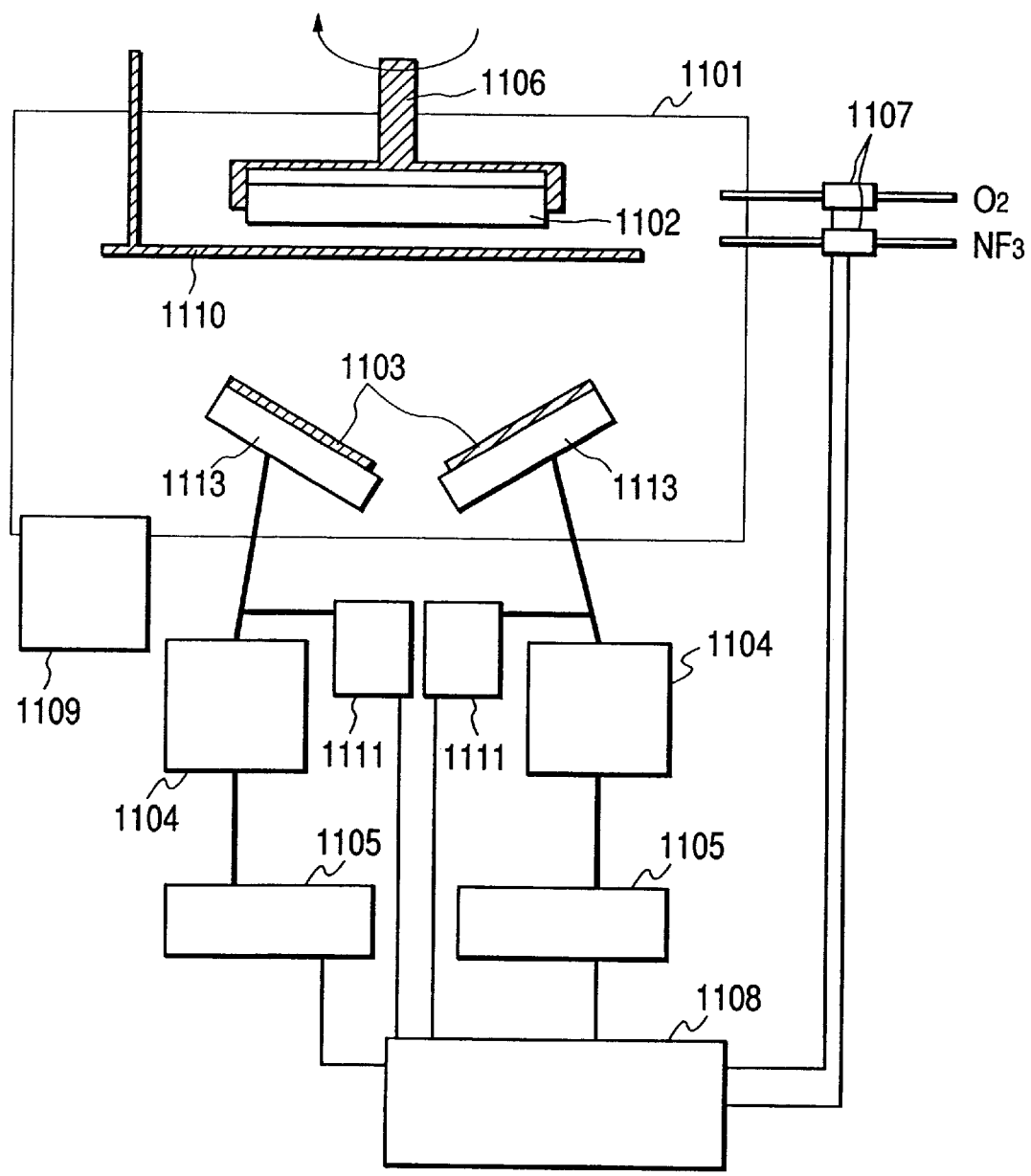
FIG. 15 illustrates schematically a sputtering apparatus employed for forming the optical thin film in Example 7.

FIG. 15 illustrates schematically the sputtering system employed in this Example. Vacuum chamber 1101 is connected to evacuation system 1109 for evacuating the inside thereof. Targets 1103 made of Y (yttrium) are fixed to magnetron cathodes 1113. Two targets are employed to offset irregularity of the film thickness of base plate 1102.

In vacuum chamber 1101, shutter 1110 is provided to screen base plate 1102 from targets 1103 until the electric discharge becomes stable. High frequency power sources 1105 generate RF of 13.56 MHz and applies it through matching boxes 1104 to the cathodes. Additionally electric power is supplied from DC power source 1111 to the cathodes.

Base plate 1102 is made of quartz. Base plate holder 1106 for holding base plate 1102 is rotatable by a rotation mechanism to offset the film thickness irregularity. Gases of $O_2$ and $NF_3$ are introduced into the chamber. The flow rates of the gases are controlled respectively by mass flow controllers 1107. The RF power, the DC power, and the gas flow rates are controlled by personal computer 1108.

The optical thin film and the process of film formation in this example are described below specifically.

Vacuum chamber 1101 was evacuated to a pressure of $1 \times 10^{-4}$ Pa or lower by evacuation system 1109. Then the gases of $O_2$ and $NF_3$ were introduced at prescribed gas flow rates through mass flow controllers 1107. The flow rates of gases of $O_2$ and $NF_3$ were controlled by personal computer 1108. Then, electric power was supplied from the power sources to target 1103 to generate plasma. The power supply was controlled by personal computer 1108, and was raised stepwise to RF of 2500 W and DC of 2000 W in about 3 minutes. Thereafter shutter 1110 was opened to start the film formation on the base plate.

Figure 16:
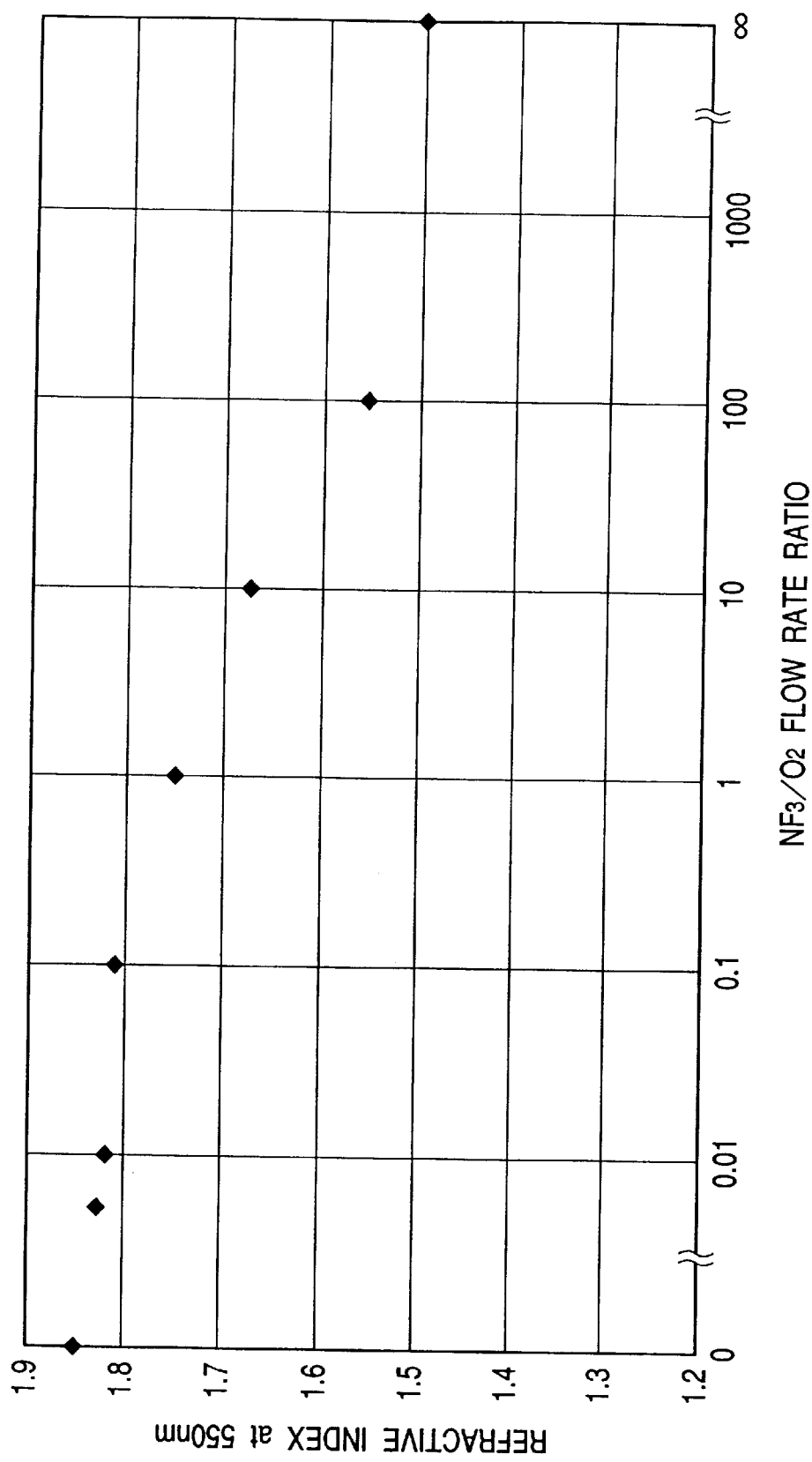
FIG. 16 shows the dependency of the refractive index of the formed film on the gas flow rate ratio of $NF_3$ to $O_2$ in sputtering.

FIG. 16 shows the dependence of the refractive index of the yttrium compound film formed on base plate 1102 by the above process upon the ratio of the gas flow rates of $NF_3$ to $O_2$. As shown in FIG. 16, the refractive index could be controlled by the gas flow rate ratio of $NF_3/O_2$.

A film having the refractive index increasing toward the surface of the film was obtained by forming the film with gradual increase of the flow rate ratio of $NF_3/O_2$ with lapse of time according to the above data.

EXAMPLE 8

The sputtering system shown in FIG. 11 was used in this example.

The optical thin film and the process of film formation in this example are described below specifically.

Vacuum chamber 701 was evacuated to a pressure of $1 \times 10^{-4}$ Pa or lower by evacuation system 709. Then the gases were introduced at prescribed gas flow rates through mass flow controllers 707. The flow rates of gases of $O_2$ and $NF_3$ were controlled by personal computer 708. Then, electric power was supplied from the power source to targets 703 made of aluminum to generate plasma. The power supply was controlled by personal computer 708, and was raised to 2500 W stepwise in about 3 minutes. Thereafter shutter 710 was opened to start the film formation on base plate 702.

Figure 17:
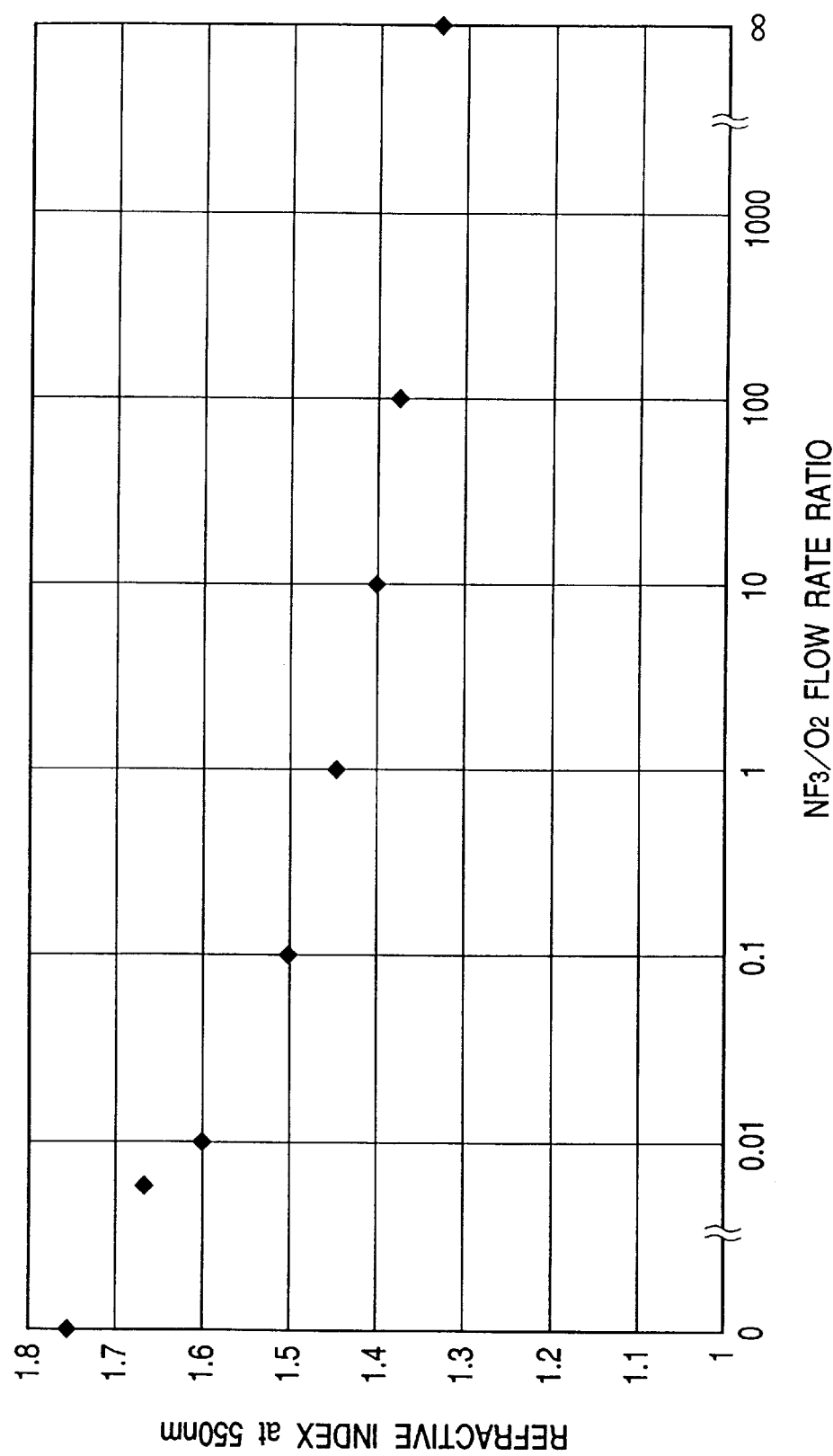
FIG. 17 shows the dependency of the refractive index of the formed film on the gas flow rate ratio of $NF_3$ to $O_2$ in sputtering.

FIG. 17 shows the dependence of the refractive index of the aluminum compound film formed on the base plate by the above process upon the ratio of the gas flow rates of $NF_3$ to $O_2$. As shown in FIG. 17, the refractive index could be controlled by the gas flow rate ratio of $NF_3$ to $O_2$.

EXAMPLE 9

The sputtering system shown in FIG. 13 was used in this example.

The optical thin film and the process of film formation in this example are described below specifically.

Vacuum chamber 901 was evacuated to a pressure of $1 \times 10^{-4}$ Pa or lower by evacuation system 909. Then the $H_2O$ gas was introduced constantly at a flow rate of 2 sccm through mass flow controller 907, and the $O_2$ gas and the $NF_3$ gas were introduced at prescribed gas flow rates through mass flow controller 907. The flow rates of gases of $O_2$, $NF_3$, and $H_2O$ were controlled by personal computer 908. Then, electric power was supplied from the power source to target 903 made of aluminum to generate plasma. The power supply was controlled by personal computer 908, and was raised to 2500 W stepwise in about 3 minutes. Thereafter shutter 910 was opened to start the film formation on base plate 902.

Figure 18:
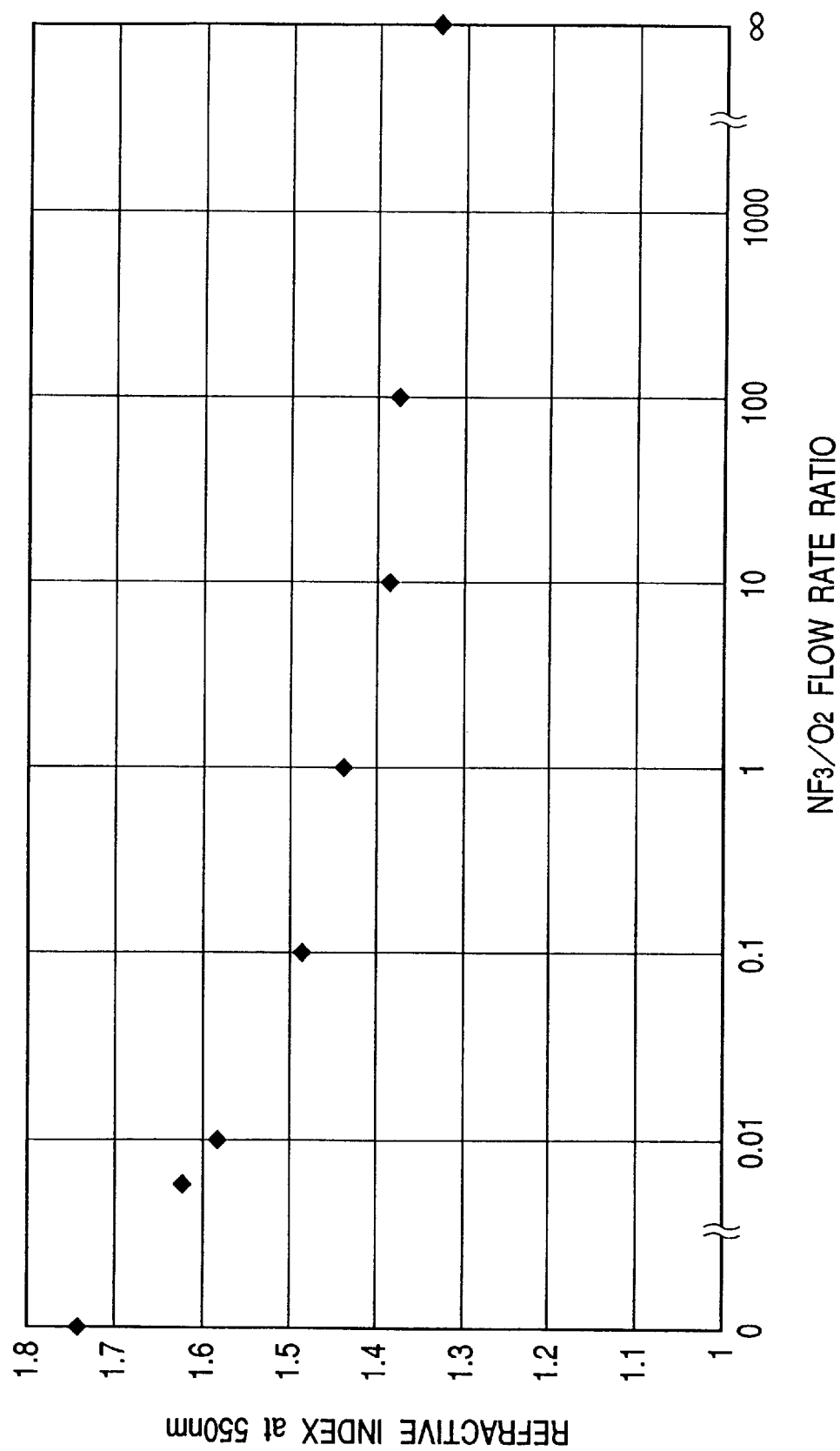
FIG. 18 shows the dependency of the refractive index of the formed film on the gas flow rate ratio of $NF_3$ to $O_2$ in sputtering.

FIG. 18 shows the dependence of the refractive index of the aluminum compound film formed on quartz base plate 902 by the above process upon the ratio of the gas flow rates of $NF_3$ to $O_2$ As shown in FIG. 18, the refractive index could be controlled by the gas flow rate ratio of $NF_3$ to $O_2$.

The present invention achieves remarkable effects enumerated below.

(1) A refraction-gradient film can be produced by sputtering without using plural target materials.

(2) An optical thin film can be produced which has high transmissivity and broad refractive index variation in wide range of wavelength by use of a nitride, and fluoride or an oxide.

(3) A refraction-gradient film can be produced which does not depend the film density.

(4) A refraction-gradient film can be produced only by varying the flow rate ratio of a nitride type gas, an oxide type gas, and a fluoride type gas, so that the refractive index can be controlled effectively with a simple control system.

(5) A refraction-gradient film can be produced from a target other than a dielectric target by only one sputtering process.

What is claimed is:

1. A process for forming a thin film having refractive index thereof varying continuously or stepwise in a thickness direction, comprising sputtering by introducing, during film formation, a nitrogen-containing gas, an oxygen-containing gas, and a fluorine-containing gas with a flow rate ratio of the fluorine-containing gas to the nitrogen-containing gas and/or the oxygen-containing gas varied continuously or stepwise.

2. A process for forming a thin film having refractive index thereof varying continuously or stepwise in a thickness direction, comprising sputtering by introducing, during film formation, at least a nitrogen-containing gas and a fluorine-containing gas with a flow rate ratio of the nitrogen-containing gas to the fluorine-containing gas varied continuously or stepwise.

3. A process for forming a thin film having refractive index thereof varying continuously or stepwise in a thickness direction, comprising sputtering by introducing, during film formation, at least an oxygen-containing gas and a fluorine-containing gas with a flow rate ratio of the oxygen-containing gas to the fluorine-containing gas varied continuously or stepwise.

4. The process for forming a thin film according to claim 1, 2 or 3, wherein a metal target employed for the sputtering is composed mainly of at least one material selected from the group consisting of Bi, Hf, Pb, Zr, Y, and Mg.

5. The process for forming a thin film according to claim 1, 2 or 3, wherein a metal target employed for the sputtering is composed mainly of Al.

6. The process for forming a thin film according to claim 1 or 2, wherein the nitrogen-containing gas contains at least one selected from the group consisting of $NF_3$, $NH_3$, $N_2O$, NO, $NO_2$, and $N_2$.

7. The process for forming a thin film according to claim 1, 2, or 3, wherein the fluorine-containing gas contains at least one selected from the group consisting of $CF_4$, $NF_3$, HF, $SF_6$, $BF_3$, $CHClF_2$, $SiF_4$, and $F_2$.

8. The process for forming a thin film according to claim 1 or 3, wherein the oxygen-containing gas contains at least one selected from the group consisting of $O_2$, $O_3$, $N_2O$, NO, $NO_2$, $CO_2$, CO, $SO_2$, and $H_2O$.

9. A process for forming a thin film as set forth in claim 1, wherein the film is selected from nitride films, oxide films, fluoride films, and mixtures thereof.

10. A process for forming a thin film as set forth in claim 2, wherein the film is selected from nitride films, fluoride films, and mixtures thereof.

11. A process for forming a thin film as set forth in claim 3, wherein the film is selected from oxide films, fluoride films, and mixtures thereof.

12. The process for forming a thin film according to claim 9, 10 or 11, wherein the film has a refractive index varying continuously or stepwise in a thickness direction in the range from 1.3 to 2.2.

13. The process for forming a thin film according to claim 9 or 11, wherein the nitride film is mainly composed of aluminum nitride.

14. The process for forming a thin film according to claim 9, 10 or 11, wherein the fluoride film is mainly composed of aluminum fluoride.

15. The process for forming a thin film according to claim 9 or 11, wherein the oxide film is mainly composed of aluminum oxide.

16. A process for forming a thin film by sputtering, comprising forming a first thin film having a first refractive index and thereafter forming a second thin film having a second refractive index different from the first refractive index, wherein the sputtering is conducted by introducing, during film formation, at least two gases, one of which is a fluorine-containing gas and the other gas or gases are a nitrogen-containing gas and/or an oxygen-containing gas, with a flow rate ratio of the fluorine-containing gas to the nitrogen-containing gas and/or the oxygen-containing gas varied continuously or stepwise to obtain a refractive index varying continuously or stepwise in a thickness direction in the neighbourhood of the boundary between the first thin film and the second thin film.

17. The process for forming a thin film according to claim 16, wherein the first thin film is formed by introducing the oxygen-containing gas; subsequently a ratio of the fluorine-containing gas to the oxygen-containing gas is increased gradually; and the second thin film is formed by introducing the fluorine-containing gas.

* * * * *